US006272060B1

United States Patent
Sheen et al.

(10) Patent No.: US 6,272,060 B1
(45) Date of Patent: Aug. 7, 2001

(54) SHIFT REGISTER CLOCK SCHEME

(75) Inventors: Ben Y. Sheen, Milpitas; Michael G. Ahrens, Sunnyvale, both of CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 09/569,820

(22) Filed: May 12, 2000

(51) Int. Cl.$^7$ .................................................. G11C 7/00
(52) U.S. Cl. ...................... 365/221; 365/189.12; 365/240
(58) Field of Search ............................... 365/221, 189.12, 365/240

(56) References Cited

U.S. PATENT DOCUMENTS

| 4,771,279 | * | 9/1988 | Hannah ................................ 340/801 |
| 4,777,624 | * | 10/1988 | Ishizawa et al. ................. 365/189.12 |
| 6,034,910 | * | 3/2000 | Iwase ................................... 365/221 |

* cited by examiner

*Primary Examiner*—Huan Hoang
(74) *Attorney, Agent, or Firm*—Bever, Hoffman & Harms, LLP; Julie A. Stephenson; Lois D. Cartier

(57) ABSTRACT

A shift register system is disclosed wherein shift registers buffering memory data perform shift operations in response to a set of sub-clock signals. The set of sub-clock signals comprise nested sub-clock signals having non-overlapping transitions formed from a system clock signal or power on reset signal. Each shift register (or bank of shift registers) responds to a different sub-clock signal. As a result, shift operations are spread out over a period of time rather than occurring simultaneously. Thus, the current drawn during each shift operation is similarly spread out over a period of time. The maximum current drawn during any one shift operation is inversely proportional to the number of non-overlapping sub-clock signal. Therefore, the maximum current drawn (i.e., current spike) drawn during memory operations is minimized.

17 Claims, 10 Drawing Sheets

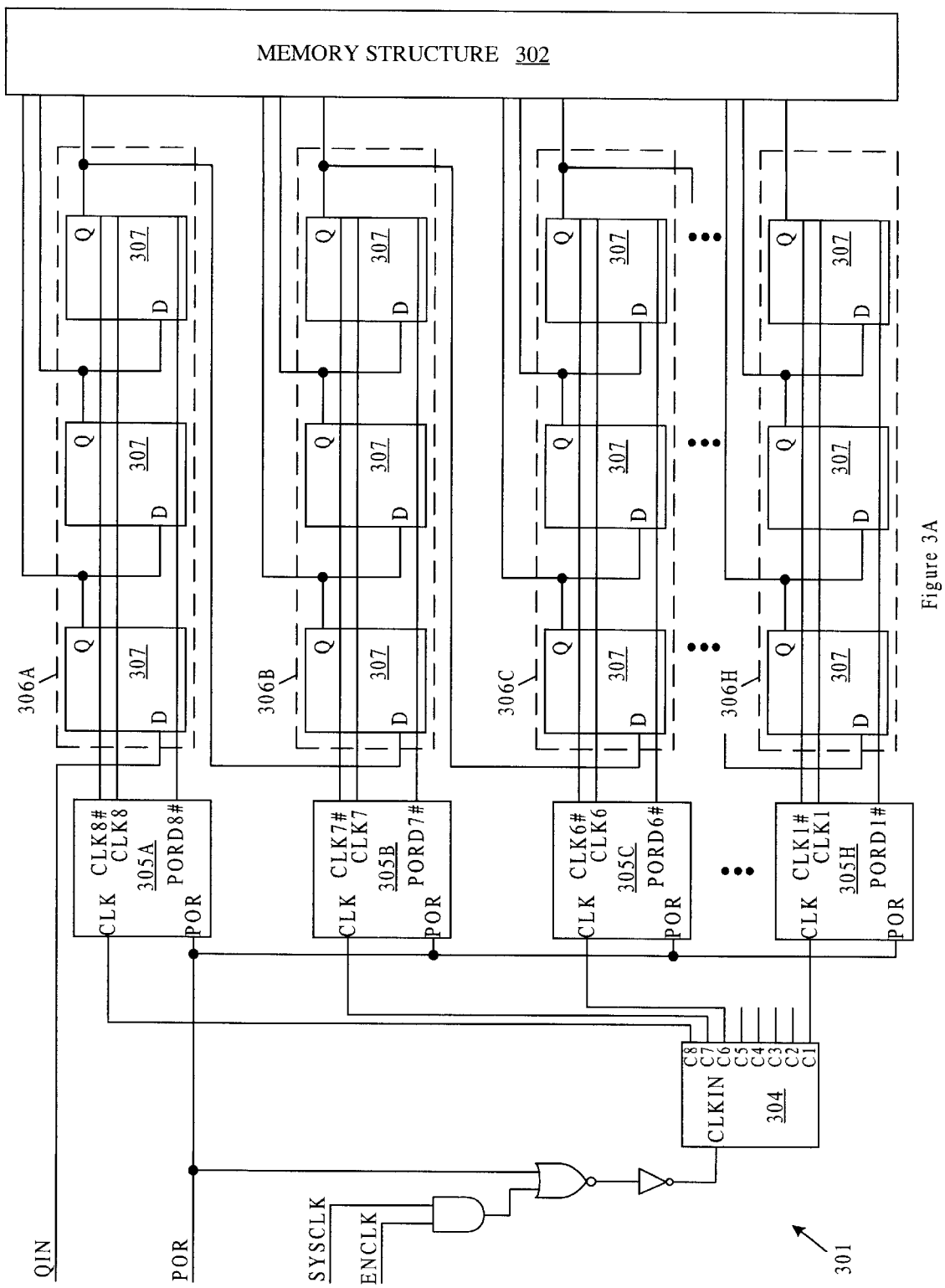

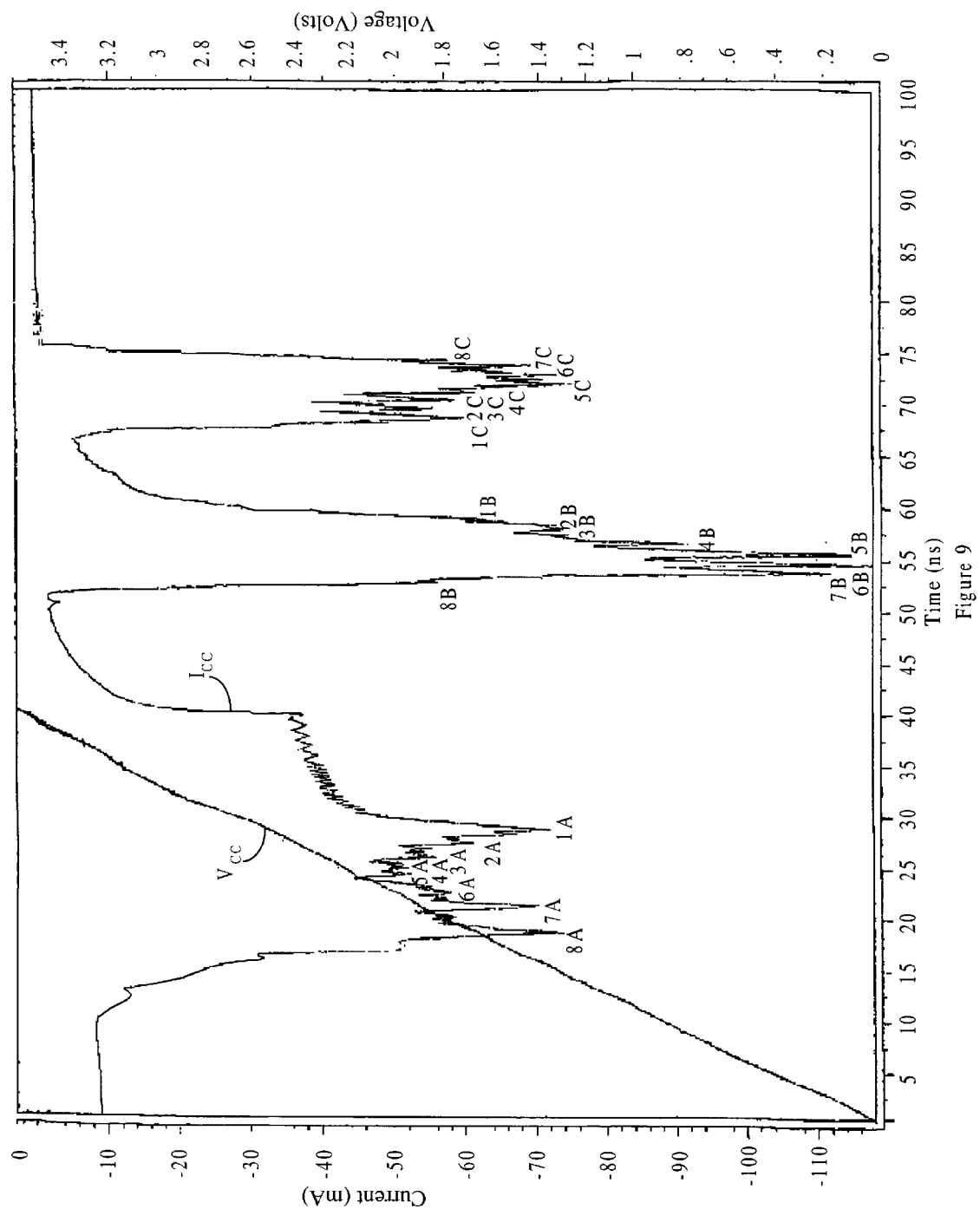

SHIFT REGISTER CLOCK SCHEME

FIELD OF THE INVENTION

The present invention relates to data registration prior to memory storage, and particularly to a clock scheme for peak current reduction during power on reset and data shifting.

DISCUSSION OF RELATED ART

Many memory cell arrays, such as serial programmable read only memory (SPROM), use commonly clocked, serially coupled flip-flops, known as a shift register, to store data prior to data storage in parallel into memory cells within a memory array. Data is serially shifted through each flip-flop in the shift register in response to clock signals until the shift register is full. When the shift register is full, then each data output of each flip-flop is stored in a memory cell. This method of data storage is called a shift register system.

FIG. 1 is a schematic diagram of such a conventional shift register system 100. A data signal QIN represents a serial data stream (e.g., a series of bits applied to an input pin of an integrated circuit). Therefore, at each clock signal, the current value of the QIN data signal corresponds to a data bit within the serial data stream. The QIN data signal is provided to a shift register 101. Shift register 101 includes commonly clocked, serially coupled flip-flops 102. A system clock signal SYSCLK and a clock enable signal ENCLK are generated by external circuitry (not shown) and are used to clock flip-flops 102. As shown in FIG. 1, the clock signal CLK received by flip-flops 102 is the logical NAND of the SYSCLK and ENCLK signals and the inverted clock signal CLK# is the inverse of the CLK signal. Each data bit in the serial data stream is serially shifted through flip-flops 102 of shift register 101 until shift register 101 is full.

Specifically, each of flip-flops 102 provide the data signal present at its input terminal D to its output terminal Q when the clock signal CLK is a logic one. This process is called shifting. Each of flip-flops 102 holds constant the data signal present at its output terminal Q when the clock signal CLK is a logic zero. Thus, a series of clock signals shifts a data bit sequentially through shift register 101. Shift register 101 is full when the first data bit in the QIN data signal reaches the last flip-flop 102 in shift register 101. When shift register 101 is full, the data at the Q output terminals of flip-flops 102 are stored in memory structure 103.

As described above, each of flip-flops 102 responds to the CLK signal at the same time. As a result, a shifting operation causes a large spike of current to be drawn as each of flip-flops 102 draws current simultaneously. As the number of flip-flops in shift register 101 increases, the magnitude of this current spike increases. A common number of flip-flops in shift register 101 is 4000.

FIG. 2 is a plot of current over time for 4000 flip-flops in a conventional shift register system during a shift operation. Note both large current spikes at time=156 ns and 173 ns. These current spikes represent the current drawn by the 4000 flip-flops for each shift operation (i.e., transition of the clock signal CLK to a logic one from a logic zero). As described above, the magnitude of these current spikes is proportional to the number of simultaneously clocked flip-flops performing the shift operation. It would be desirable to minimize the peak current spike during such a shift operation.

When shift register system 100 powers on, a power on reset signal (POR) is asserted high. This logic one value of the POR signal causes an initialization operation in which a logic one is forced into the Q output terminal of each flip-flop 102. As a result, when shift register system 100 powers on, each of flip-flops 102 is initialized to one. For reasons similar to those of the shifting operation described above, flip-flops 102 draw a large spike of current during the initialization operation. Therefore, it is also desirable to minimize the peak current (the current spike) drawn during an initialization operation.

SUMMARY OF THE INVENTION

A shift register clocking scheme is disclosed wherein flip-flops buffering memory data perform shift operations in response to a set of sub-clock signals. Sub-clock signals are multiple clock signals generated in response to a primary (e.g., system) clock signal. The set of sub-clock signals comprises a number (e.g., eight) of nested sub-clock signals formed from a system clock signal or power on reset command signal. Specifically, the rising edge of the first sub-clock signal occurs prior to the rising edge of the second sub-clock signal and the falling edge of the first sub-clock signal occurs after the falling edge of the second sub-clock signal, thereby nesting the second sub-clock signal within the first sub-clock signal.

The flip-flops are divided among a set of shift registers, each shift register being clocked by one of the set of sub-clock signals. As a result of utilizing sub-clock signals, shift operations for each shift register are spread out over a period of time rather than occurring simultaneously in all shift registers. Spreading out the shift operations of the shift registers causes a series of small current draws corresponding to the shift operation of each shift register.

The total amount of current drawn during these spread out shift operations is comparable to the total amount of current drawn in conventional shift register systems having the same number of flip-flops. However, because fewer flip-flops are clocked by a given sub-clock signal in the present invention than by a given clock pulse in conventional memory systems, the peak current drawn during any one shifting operation in the present invention is much less than the peak current drawn in conventional shift register systems. Therefore, the peak current drawn by the present invention during memory operations is minimized.

BRIEF DESCRIPTION OF THE DRAWINGS

FIG. 3A is a schematic diagram of a shift register system in accordance with one embodiment of the present invention;

FIG. 9 is a plot of both current and voltage over time during a power on operation for a shift register system in accordance with one embodiment of the present invention.

DETAILED DESCRIPTION OF THE INVENTION

Figure 1:
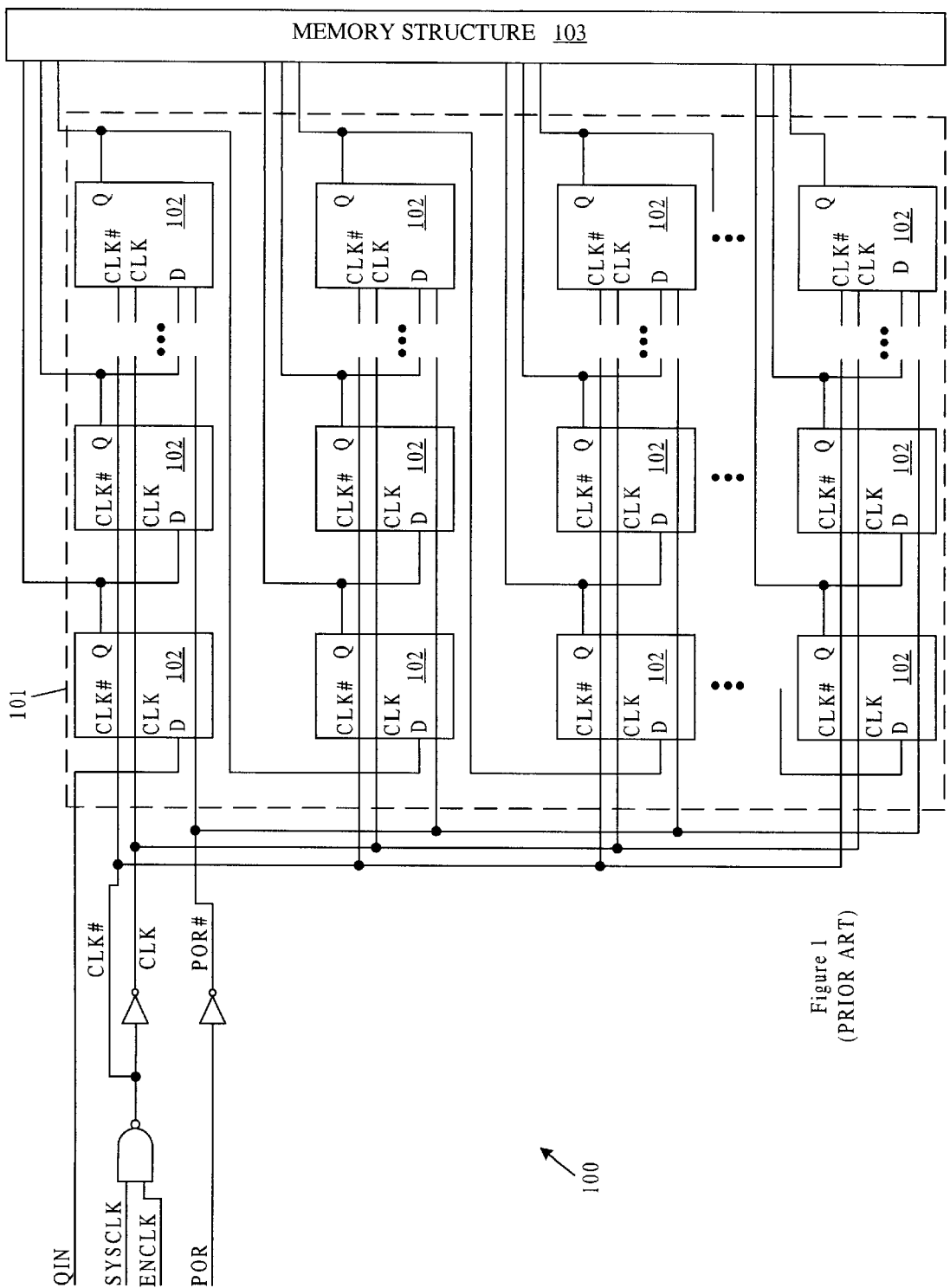
FIG. 1 is a schematic diagram of a conventional shift register system.

FIG. 3A illustrates a shift register system 301 in accordance with one embodiment of the present invention. Shift register system 301 temporarily stores data bits of the QIN data signal prior to storage of those data bits in memory structure 302. Shift register system 301 receives a system clock signal SYSCLK, a clock enable signal ENCLK, a power on reset command signal (POR), and a data signal QIN. The SYSCLK signal is the system clocking signal that synchronizes operations within an integrated circuit (not shown) containing shift register system 301.

In this embodiment, shift operations are performed in response to a set of sub-clock signals C1–C8. Sub-clock signals C1–C8 are formed by clock delay circuit 304 in response to the SYSCLK and ENCLK signals or, alternately, in response to the POR signal. Specifically, the signal provided to the CLKIN input terminal of clock delay circuit 304 is a logic one if one of the POR signal is a logic one and both the SYSCLK and ENCLK signals are logic ones. The ENCLK signal is asserted high during normal operation to enable shift register system 301. When shift register system 301 is enabled, the SYSCLK signal is used to enable data storage in memory structure 302 through shift register system 301. To disable shift register system 301 from normal operation, the ENCLK signal is de-asserted low. When shift register system 301 is disabled, data storage in shift register system 301 is disabled. The POR signal is asserted high during a power on operation of the integrated circuit (not-shown) including shift register system 301. Once the power on operation completes, the POR signal is deasserted low. The QIN data signal is a serial data stream of data bits to be stored in shift register system 301.

Each sub-clock signal C1–C8 is available to clock one of the clock phase generation circuits 305. Each clock phase generation circuit 305 generates a set of control signals for one of shift registers 306. Thus, clock phase generation circuit 305A generates a set of control signals (CLK8#, CLK8, and PORD8#) for shift register 306A. In this embodiment, shift registers 306 are serial-in serial-out shift registers, and each shift register 306 includes three flip-flops 307. Shift registers 306 are serially coupled.

In accordance with the present invention, sub-clock signals C1–C8 are nested clock signals. Nested clock signals do not have overlapping transitions (e.g., rising or falling edges). Specifically, the rising edge of the first sub-clock signal C8 occurs prior to the rising edge of the second sub-clock signal C7 and the falling edge of the first sub-clock signal C8 occurs after the falling edge of the second sub-clock signal C7. Because sub-clock signals C1–C8 have non-overlapping transitions, each shift register 306 shifts at a different time. Therefore, in this embodiment, flip-flops 307 shift in groups of three. As a result, the number of flip-flops responding to a given sub-clock signal in the present embodiment is one-eighth (i.e., three) the number of flip-flops responding to a global clock signal in a conventional shift register system having the same number of flip-flips (i.e., twenty-four) such as that of FIG. 1 (having 24 flip-flops 102).

A current is drawn during the shift operation of each shift register 306. This current is characterized by an amount of current flowing during the shift operation of the register and the peak value of this amount of current. The peak current is the greatest amount of current drawn at one time in response to the CLK clock signal by each of these shift operations. Because the number of flip-flops 307 responding to an edge of a CLK clock signal (i.e., to each of sub-clock signals C1–C8) has been decreased from the number responding in a conventional shift register system by a factor of eight, both the current drawn and the peak current drawn by the associated shift register are also decreased by a factor of eight.

Note that if the shift operations of all shift registers 306 are considered, then the total current drawn by shift register system 301 is similar to that drawn by a conventional shift register system having a similar number of flip-flops. However, the peak current of shift register system 301 has been reduced to one-eighth of the peak current in a conventional shift register system. As a result, while the total current drawn during a shift operation of the shift register system remains the same, the peak current spike caused by each of these shift operations in the present invention is much less than the peak current spike caused by the shift operation of a conventional shift register system such as that of FIG. 1.

Shift register system 301 serially shifts data through flip-flops 307 until each flip-flop stores a data bit from the QIN serial data stream. At this time, shift register system 301 is full. The data present at each flip-flop Q output terminal is then stored in memory structure 302 in parallel.

Figure 3B:
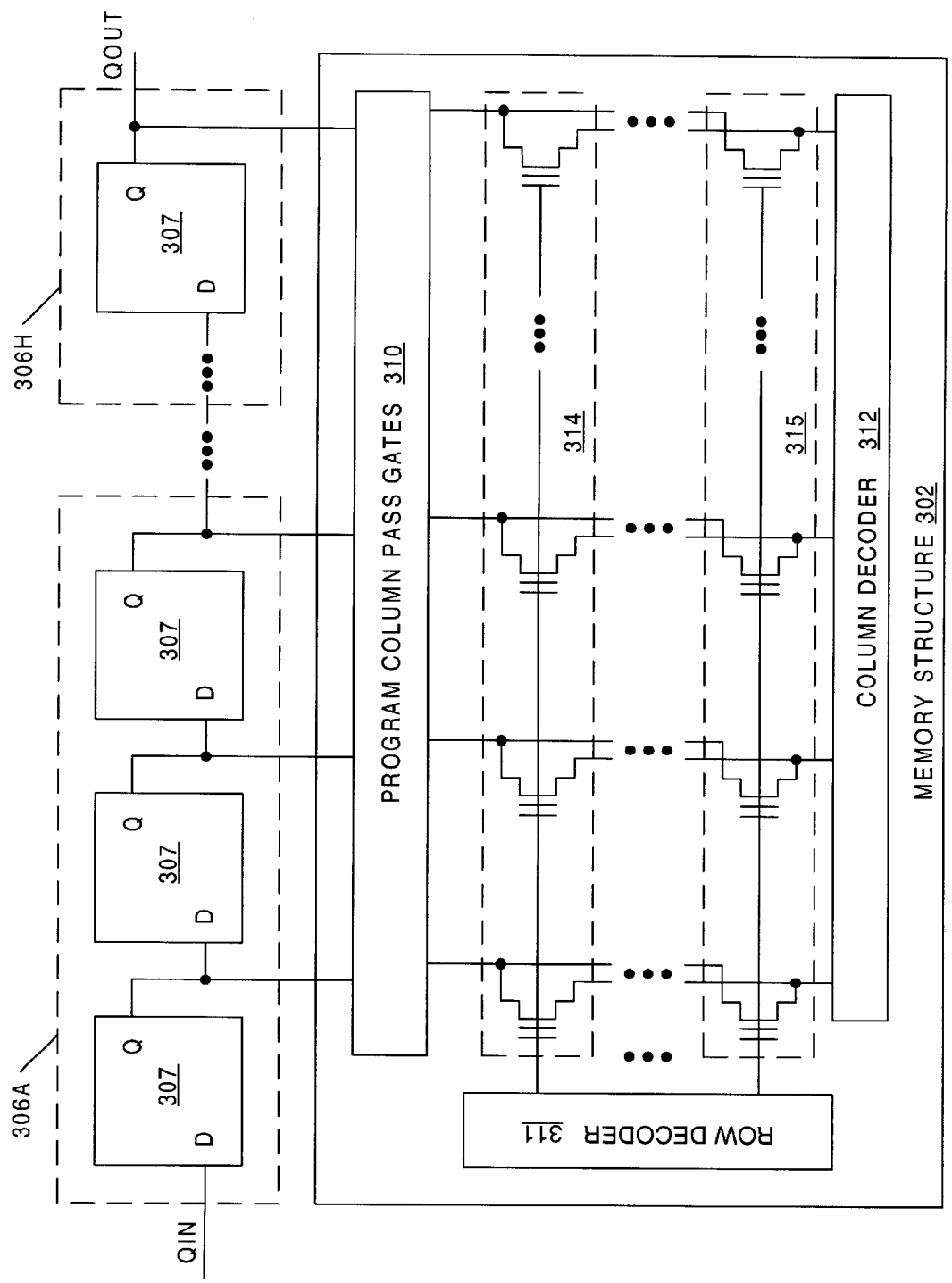
FIG. 3B is a schematic diagram of one embodiment of a memory structure in accordance with one embodiment of the present invention.

FIG. 3B illustrates one embodiment of memory structure 302, register 306A, and a portion of register 306H. Conventional memory structure 302 includes a row decoder 311, column decoder 312, program column pass gates 310, and rows of memory 314–315. Data from the Q output terminals of flip-flops 307 is stored in one of rows of memory 314–315. Program column pass gates 310 control data availability for storage. Thus, program column pass gates 310 pass data from the Q output terminals of flip-flops 307 to one of rows of memory 314–315. Row decoder 311 and column decoder 312 enable memory cells within rows of memory 314–315. Enabled memory cells store data from the Q output terminals of flip-flops 307. In one embodiment, all memory cells within one of rows of memory 314–315 are enabled for data storage. As a result, when shift registers 306A–306H are full, program column pass gates 310 pass data from flip-flops 307 to a row of memory determined by row decoder 311.

Figure 4:
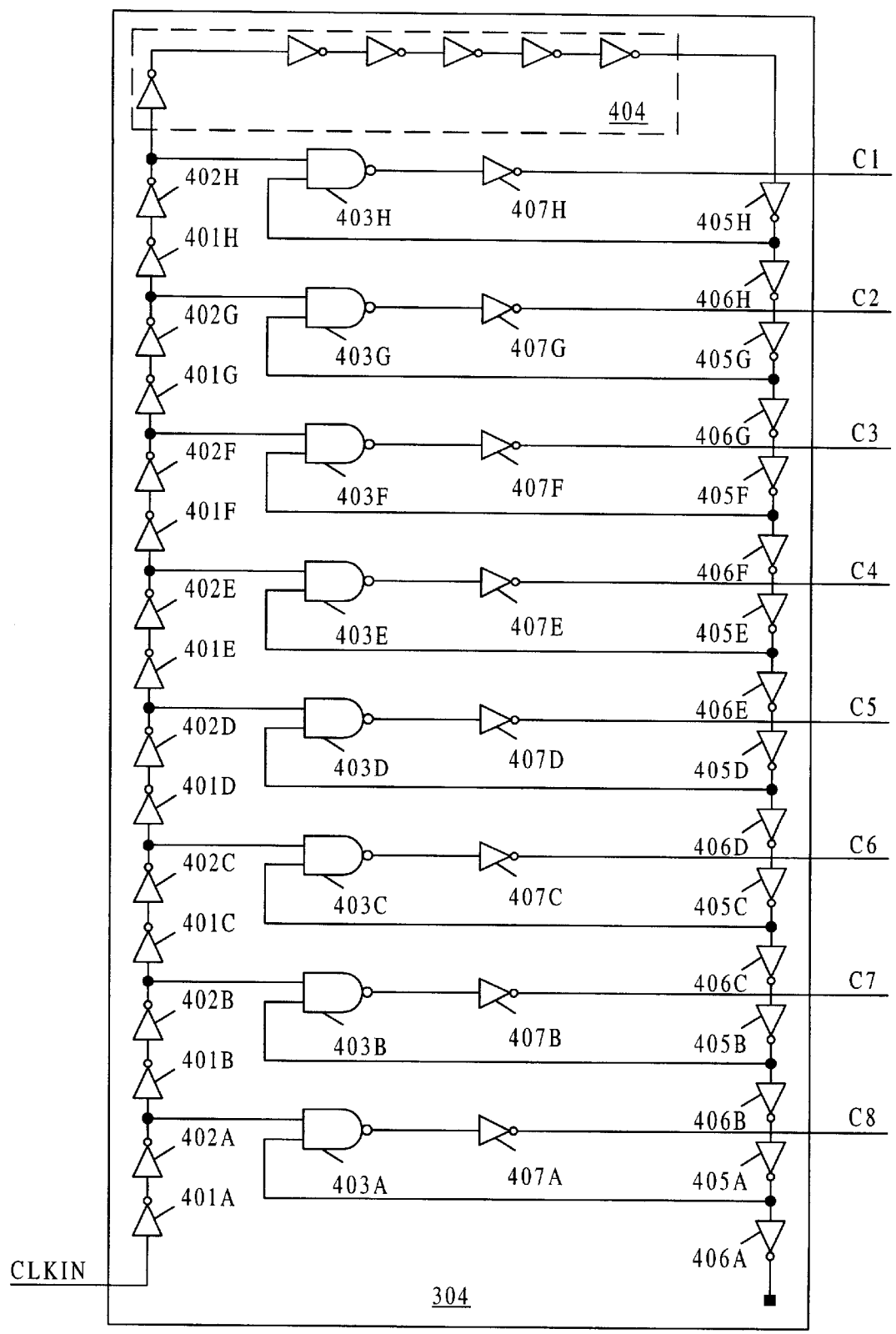
FIG. 4 is a schematic diagram of a clock delay circuit in accordance with one embodiment of the present invention.

FIG. 4 is a schematic diagram of clock delay circuit 304. Note that, because the default value of the CLKIN signal is zero (each of the SYSCLK, ENCLK, and POR signals are zero), the first input terminal of each of NAND gates 403 initially receives a logic zero through inverters 401–402 and the second input terminal of each of NAND gates 403 initially receives a logic one through inverter set 404 and inverters 401–402 and 405–406. In one embodiment, each inverter 401–402 and 405–406 contributes a delay of 0.75 ns. Each set of inverters 401–402 buffer the CLKIN signal to a respective NAND gate 403. Thus, a first input terminal of NAND gates 403B and 403H receive an edge of the CLKIN signal 1.5 ns and 10.5 ns, respectively, after the first input terminal of NAND gate 403A. Inverter set 404 further buffers and delays the CLKIN signal for 17.25 ns before providing that signal to inverters 405–406. As a result, inverter 405H receives an edge of the CLKIN signal 27.75 ns after NAND gate 403A. Note that the number of inverters in and the amount of delay of inverter set 404 varies in other embodiments, but the number of inverters is always an even number.

Each set of inverters 405–406 further buffers and delays the CLKIN signal. Thus, each inverter 405 inverts the CLKIN signal and provides this inverted CLKIN signal to the second input terminal of a respective NAND gate 403. Because inverter set 404 and inverter 405H contribute a delay of 17.25 ns and 0.75 ns, respectively, the second input terminal of NAND gate 403H receives an edge of the CLKIN signal 18 ns after the first input terminal of NAND gate 403H. Thus, when the leading edge of the CLKIN signal reaches the first input terminal of NAND gate 403H, the C1 sub-clock signal transitions from a logic zero to a logic one. Therefore, the C1 sub-clock signal transitions from a logic zero to a logic one 12 ns (i.e., the delay of inverters 401–402) after the CLKIN signal transitions from a logic zero to a logic one. Similarly, when the leading edge of the CLKIN signal reaches the second input terminal of NAND gate 403H, the C1 sub-clock signal transitions from a logic one to a logic zero. As a result, the signal width (i.e., the amount of time between the rising and falling edges of the signal) of the C1 sub-clock signal provided by inverter 407H from NAND gate 403H is 18 ns (17.25 ns (404) +0.75 ns (405H)).

In a similar manner, the second input terminal of NAND gate 403G receives an edge of the CLKIN signal 21 ns (i.e. 17.25 (404)+5 (0.75) (401H, 402H, 405H, 406H, 405G)) after the first input terminal of NAND gate 403G. Thus, when the leading edge of the CLKIN signal reaches the first input terminal of NAND gate 403H, the C2 sub-clock signal transitions from a logic zero to a logic one. Therefore, the C2 sub-clock signal transitions from a logic zero to a logic one 10.5 ns (i.e., the delay of inverters 401A–402A to 401G–402G) after the CLKIN signal transitions from a logic zero to a logic one. Note that the C2 sub-clock signal transitions to a logic one prior to the transition of the nested C1 sub-clock signal. Similarly, when the leading edge of the CLKIN signal reaches the second input terminal of NAND gate 403G, the C2 sub-clock signal transitions from a logic one to a logic zero. As a result, the signal width of the C2 sub-clock signal provided by inverter 407G from NAND gate 403G is 21 ns. Note that the C2 sub-clock signal transitions to a logic zero after the transition of the nested C1 sub-clock signal. Because the C1 sub-clock signal is nested within the signal width of the C2 sub-clock signal, the C1 and C2 sub-clock signals have non-overlapping transitions (i.e., rising and falling edges). Therefore, in response to one of the POR signal transitioning to a logic one and the SYSCLK and ENCLK signals transitioning to a logic one, a set of nested sub-clock signals are generated by clock delay circuit 304.

Figure 5:
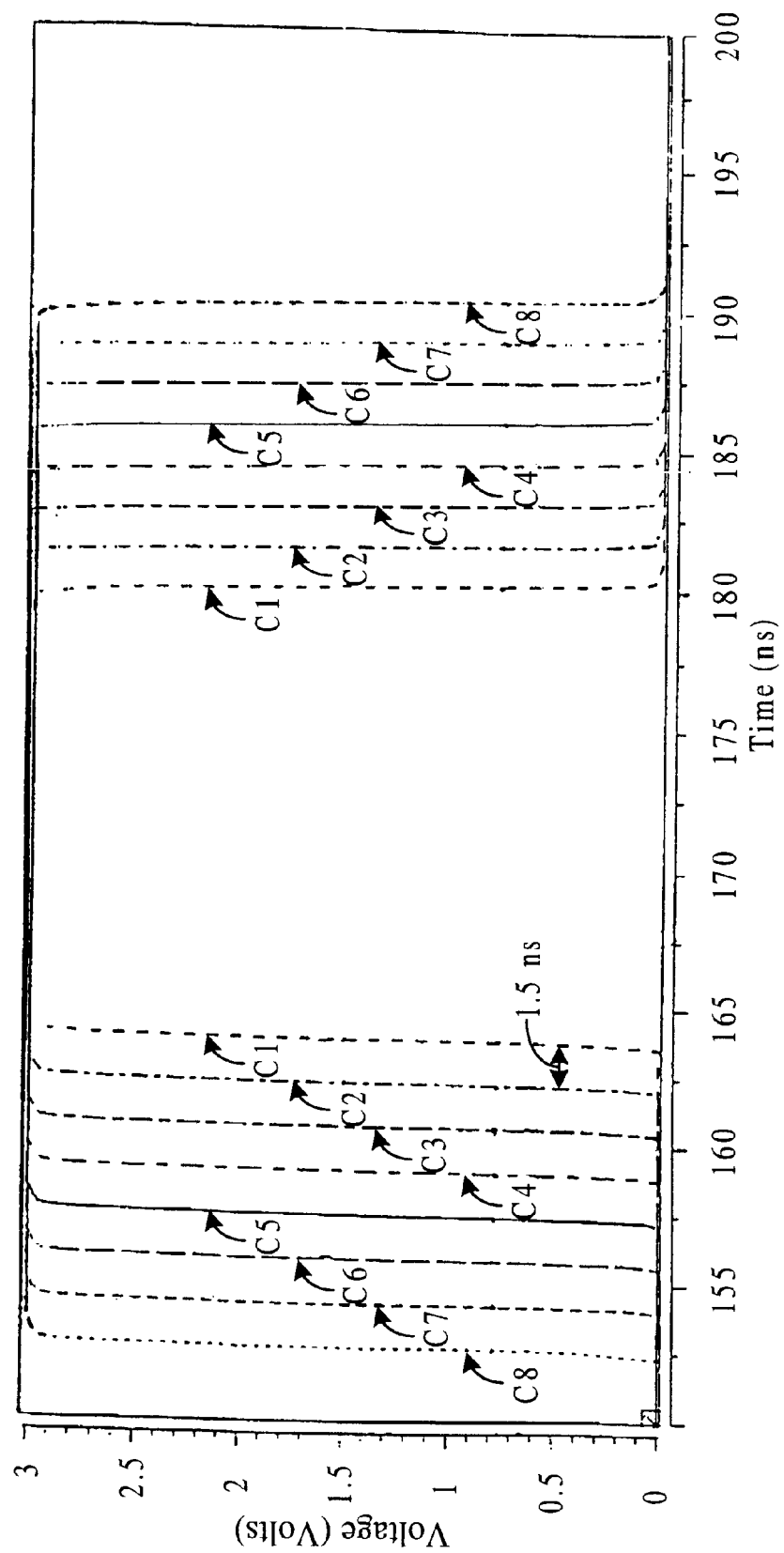
FIG. 5 is a plot of voltage over time for a clock delay circuit in accordance with one embodiment of the present invention.

For similar reasons, the C3–C8 sub-clock signals transition to a logic one 1.5 ns prior to the C2–C7 sub-clock signals, respectively, and transition to a logic zero 1.5 ns after the C2–C7 sub-clock signals, respectively. Therefore, the C1–C8 sub-clock signals have non-overlapping transitions. Note that the signal width of each of the C1–C8 sub-clock signals depends solely on the delay of inverter set 404 and inverters 401–402 and 405–406. The C1–C8 sub-clock signals are plotted over time in FIG. 5.

Figure 6:
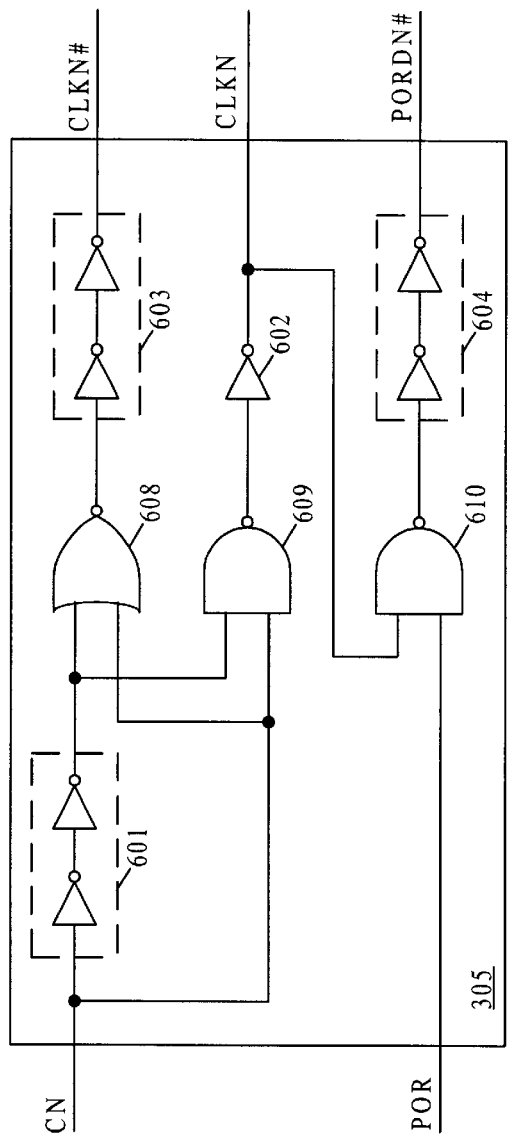
FIG. 6 is a schematic diagram of a clock phase generation circuit in accordance with one embodiment of the present invention.

FIG. 6 is a schematic diagram of clock phase generation circuit 305 in accordance with the present invention. Clock phase generation circuit 305 uses the sub-clock signal CN and the POR signal to create a set of control signals including sub-clock signals CLKN and CLKN# and the delayed POR signal PORDN#. Clock phase generation circuits 305A–305H are similar to clock phase generation circuit 305.

The POR signal remains at a logic zero unless the integrated circuit (not shown) including shift register system 301 (FIG. 3) performs a power on operation. During normal operation (i.e., the POR signal is a logic zero) the logic zero of the POR signal drives NAND gate 610 and buffer 604 to provide a logic one delayed POR (PORD) signal, PORDN#. If the IC is performing a power on operation (i.e., the POR signal is a logic one), then the state of the PORDN# signal is dependent upon the CLKN signal. Specifically, if the sub-clock signal CLKN is a logic one, then NAND gate 610 and buffer 604 provide a logic zero PORDN# signal. On the other hand, if the sub-clock signal CLKN is a logic zero, then NAND gate 610 and buffer 604 provide a logic one PORDN# signal.

A logic one CN sub-clock signal causes NOR gate 608 to provide a logic zero to buffer 603, thereby causing the CLKN# sub-clock signal to transition to a logic zero. NAND gate 609, receiving the logic one CN sub-clock signal as well as its buffered equivalent via buffer 601, provides a logic zero to inverter 602, thereby causing the CLKN sub-clock signal to transition to a logic one. Due to circuit delays in buffer 601, the CLKN# sub-clock signal transitions to a logic zero before the CLKN sub-clock signal transitions to a logic one in response to the leading edge of the CN sub-clock signal. Similarly, the CLKN# sub-clock signal transitions to a logic one after the CLKN sub-clock signal transitions to a logic zero in response to the trailing edge of the CN sub-clock signal.

Figure 7A:
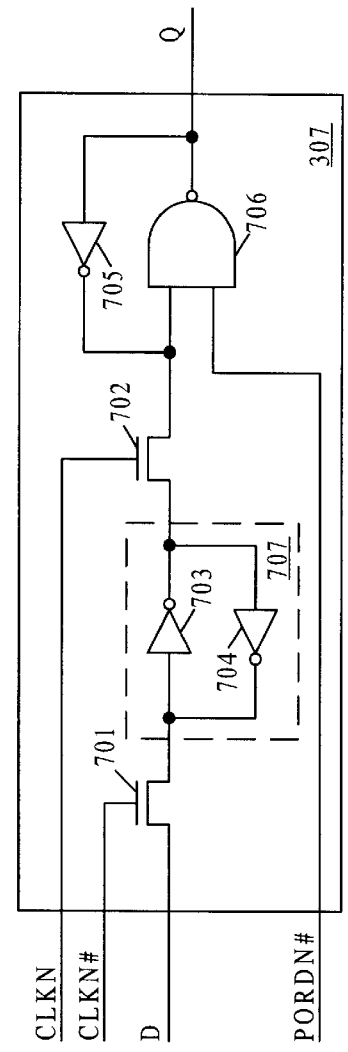
FIG. 7A is a schematic diagram of a shift register in accordance with one embodiment of the present invention.

FIG. 7A is a schematic diagram of a flip-flop 307 in accordance with one embodiment of the present invention. In this embodiment, three flip-flops 307 are included in each of shift registers 306 (FIG. 3). Each clock phase generation circuit 305 (FIG. 6) controls a respective shift register 306.

Flip-flops 307 provide the current data applied at each flip-flop D input terminal to the associated flip-flop Q output terminal when the CLKN sub-clock signal is one, and provide an internally stored value at the associated flip-flop Q output terminal when the CLKN sub-clock signal is zero. Flip-flops 307 shift data in response to the sub-clock signals CLKN and CLKN# (where N=1, 2, . . . 8). Specifically, flip-flops 307 are serially coupled such that the data provided at the Q output terminal of one flip-flop is received by the D input terminal of another flip-flop.

Referring to FIGS. 6 and 7A, CLKN and CLKN# sub-clock signals shift data through shift register 306 in the following manner. Prior to the rising edge of the CN sub-clock signal, the CLKN sub-clock signal is a logic zero and the CLKN# sub-clock signal is a logic one. The logic zero of the CLKN sub-clock signal turns off access transistor 702, thereby de-coupling the output terminal of latch 707, which is formed by inverters 703–704, from the first input terminal of NAND gate 706. The logic one of the CLKN# sub-clock signal turns on access transistor 701, thereby coupling the D input data signal to the input terminal of latch 707. As a result, the inverted value of the D input data signal is provided at the output terminal of latch 707.

The rising edge of the CN sub-clock signal causes the sub-clock signal CLKN# to transition to a logic zero, thereby turning off access transistor 701. As a result, the value of the D input data signal is latched into latch 707. The rising edge of the CN sub-clock signal then causes the CLKN sub-clock signal to transition to a logic one, thereby turning on access transistor 702. As a result, the inverse of the D input data signal is provided to the first input terminal of NAND gate 706. If the system is in normal operation, then the PORDN# signal is a logic one. As a result, the D input data signal is provided as the output of NAND gate 706. Therefore, a logic zero of the D input data signal causes a logic zero of the Q output data signal to be provided by flip-flop 307.

The trailing edge of the CN sub-clock signal causes the CLKN sub-clock signal to transition to a logic zero, thereby turning off access transistor 702 and the CLKN# sub-clock signal to transition to a logic one, thereby turning on access transistor 701. As a result, latch 707 latches a new D input data signal. Feedback transistor 705 and NAND gate 706 maintain the logic value previously stored by latch 707.

During an initialization operation (i.e., the POR signal is a logic one) the PORN# signal transitions to a logic zero when the CN signal transitions to a logic one. As explained with respect to FIG. 4, the CN signal transitions to a logic one in response to this logic high value of the POR signal. The logic zero of the PORDN# signal forces the Q output signal to a logic one through NAND gate 706. Because each Q output signal is coupled serially to another D input terminal of another flip-flop 307, a logic zero is stored in latch 707 when the CLKN signal goes low (and the corresponding CLKN# signal goes high). As a result, flip-flops 307 are initialized to one by the POR signal during a reset operation.

Figure 7B:
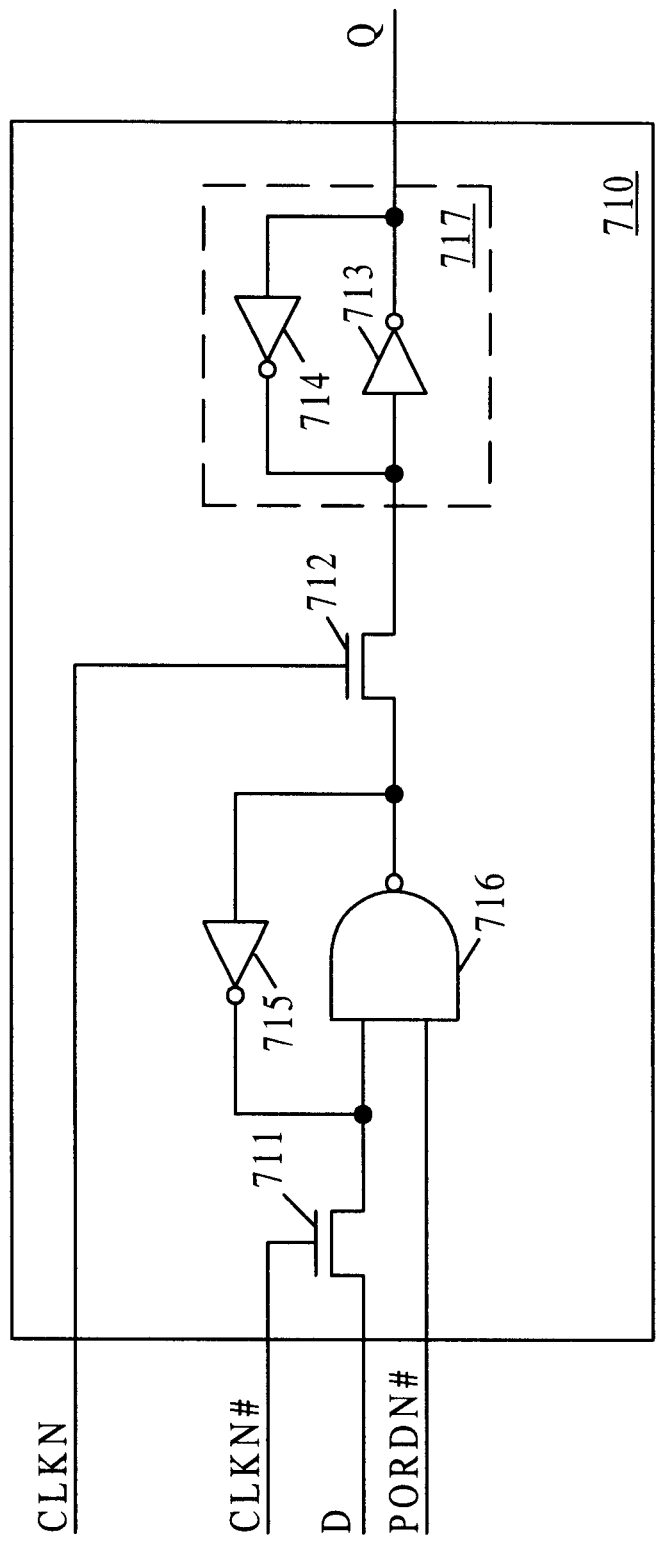
FIG. 7B is a schematic diagram of a shift register in accordance with another embodiment of the present invention.

FIG. 7B is a schematic diagram of a flip-flop 710 in accordance with another embodiment of the present invention. Flip-flop 710 operates similarly to flip-flop 307 (FIG. 7A) during normal operation (i.e., the PORDN# signal is high). Specifically, if the CLKN signal is low, the current inverted D input data signal is provided to NAND gate 716 through a conducting transistor 711 and is stored at the output terminal of NAND gate 716 with the aid of feedback inverter 715. If the CLKN signal is high, the stored value of the inverted D input data signal is provided to latch 717, thereby providing the stored D input signal at the Q output terminal of flip-flop 710. Note that during a power on operation, the low PORDN# signal forces a logic one at the output of NAND gate 716, thereby initializing all flip-flops 710 to zero.

Figure 2:
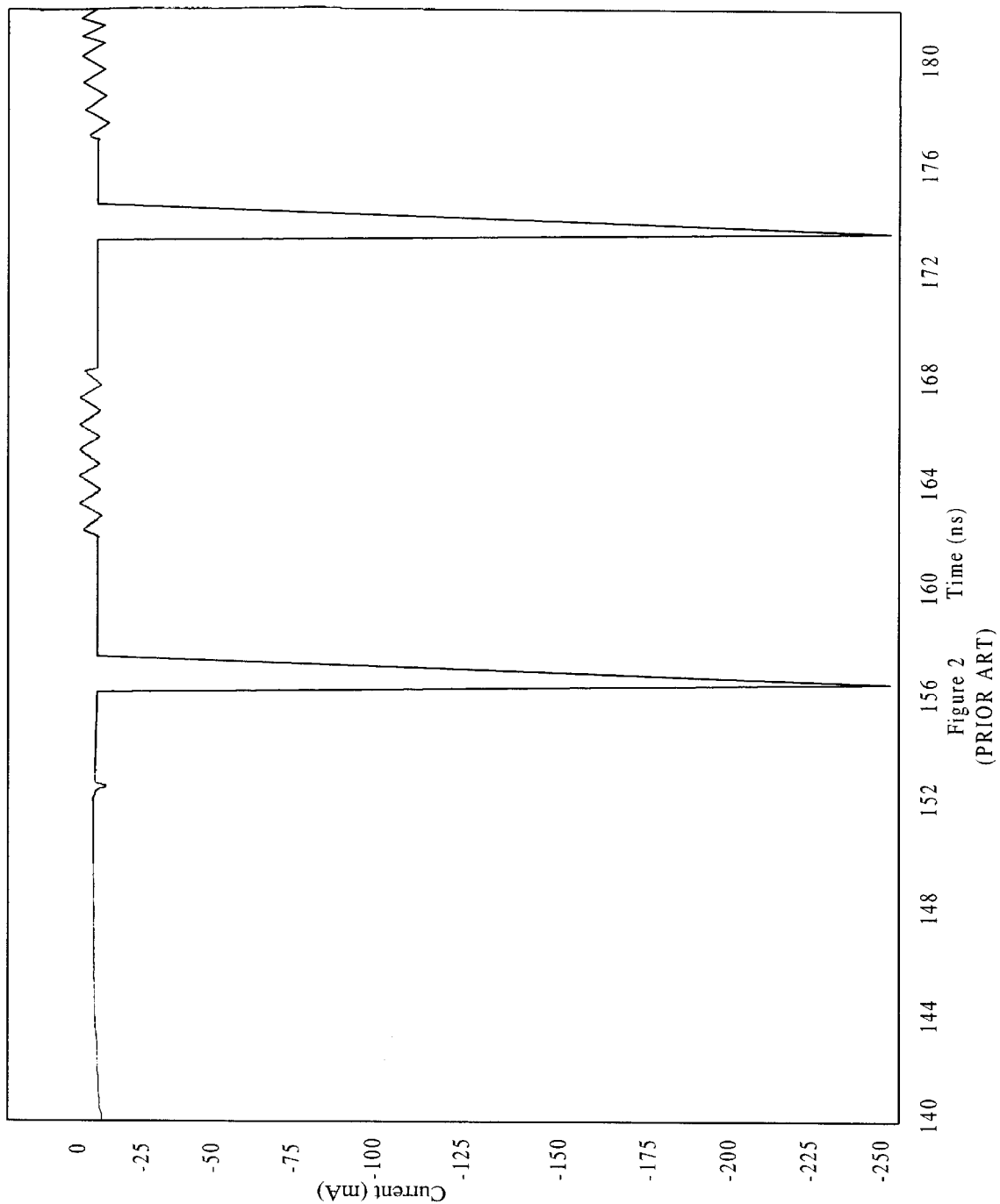
FIG. 2 is a plot of current over time during a conventional shift operation.
Figure 8:
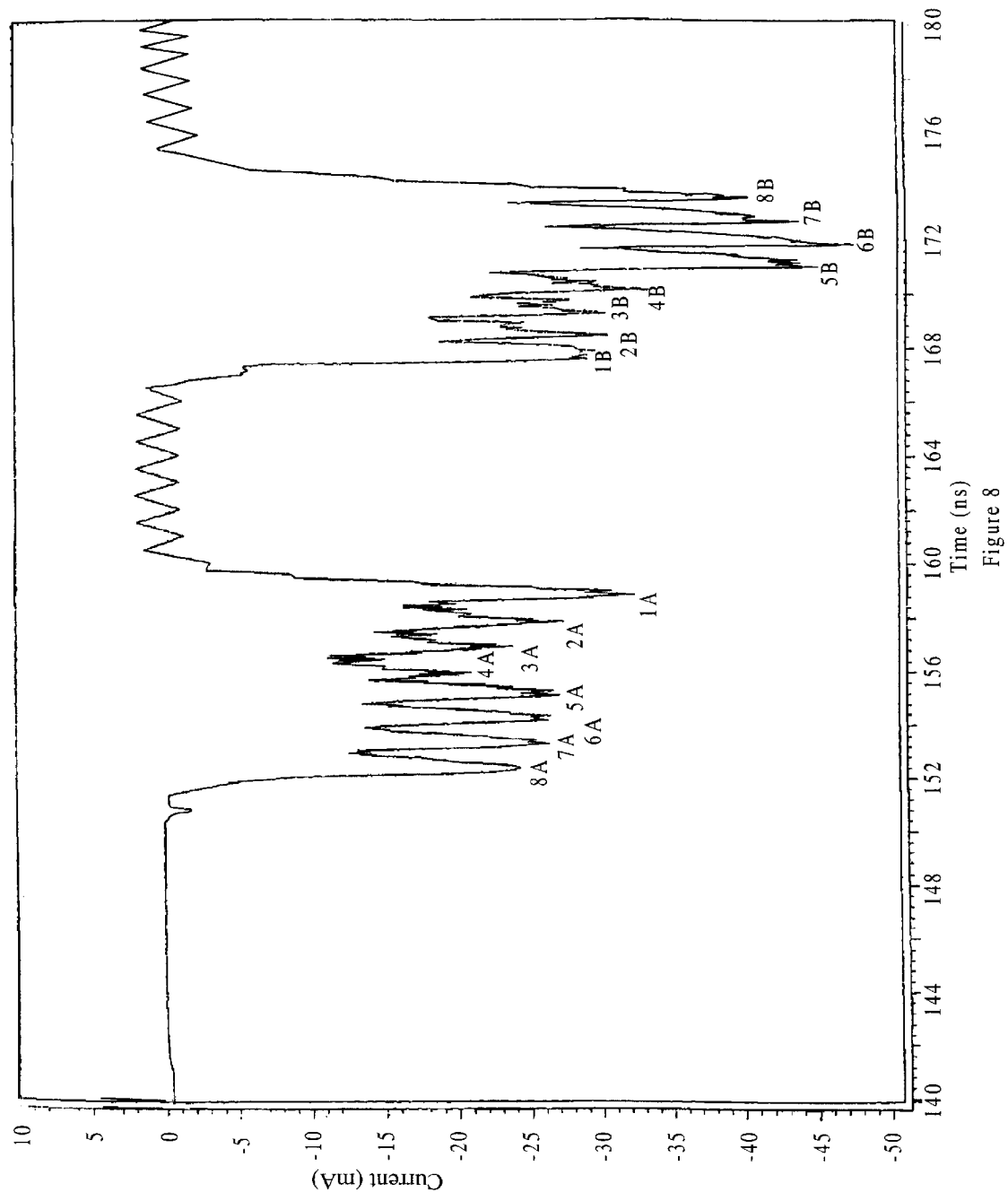
FIG. 8 is a plot of current over time for a shift register system in accordance with one embodiment of the present invention.

FIG. 8 is a plot of current over time during a shift operation for a shift register system in accordance with the present invention having 4000 flip-flops divided into eight shift registers of 500 flip-flops each. Thus, each non-overlapping sub-clock signal clocks only 500 flip-flops. Note that the eight shift operations in response to the eight sub-clock signals result in a series of eight small peaks of drawn current, each peak due to 500 flip-flops, as compared to the conventional single spike of drawn current due to 4000 flip-flops as shown in FIG. 2. Peaks 1A–8A occur in response to the rising edge of the eight sub-clock signals and peaks 1B–8B occur in response to the falling edge of the eight sub-clock signals. While the total amount of the current drawn is approximately the same between the conventional method and the approach of the present invention, the magnitude of the current drawn at any one time (i.e., peak current) is significantly lessened by the present approach (e.g., peak 1A of FIG. 8 occurring at 159 ns is −32 mA compared to −250 mA occurring at 156 ns in FIG. 2).

FIG. 9 is a plot of both current and voltage over time for a power on reset operation for a 4000 shift register system in accordance with an embodiment of the present invention. The 4000 flip-flops are again divided into eight shift registers of 500 flip-flops each. Thus, each sub-clock signal clocks only 500 flip-flops. The eight current peaks (denoted 1A–8A) from 18 ns to 30 ns represent the current drawn during a reset operation. Similarly, the eight current peaks (denoted 1B–8B) from 50 ns to 60 ns and the eight current peaks (denoted 1C–8C) from 68 ns to 73 ns represent the rising and falling edges, respectively, of the sub-clock signals C1–C8 during normal operation. Again, note the eight small current draws in response to eight sub-clock signals for each operation.

Although the invention has been described in connection with the present embodiment, it is understood that this invention is not limited to the embodiment disclosed, but is capable of various modifications which would be apparent to a person skilled in the art. For example, different numbers of sub-clock signals may be generated driving different numbers of shift registers and other embodiments can have other numbers of sub-clock signals. Thus, in another embodiment, four banks of shift registers having three shift registers each may be driven by four sub-clock signals, respectively. Thus, the invention is limited only by the following claims.

We claim:

1. A memory system comprising:

a first serial-in serial-out shift register receiving a data signal, the first shift register being controlled by a first clock signal; and a second serial-in serial-out shift register coupled in series with the first shift register and providing an output data signal, the second shift register being controlled by a second clock signal, wherein the second clock signal has a rising edge occurring a first time period after a rising edge of the first clock signal and a falling edge occurring a second time period prior to a falling edge of the first clock signal.

2. The memory system of claim 1, wherein the first time period equals the second time period.

3. A memory system comprising:

a clock delay circuit generating a first clock signal and a second clock signal, the second clock signal being nested inside the first clock signal;

a first clock phase generation circuit generating a first control clock signal, the first clock phase generation circuit being clocked by the first clock signal;

a first shift register having a first input terminal and a first output terminal, the first shift register being clocked by the first control clock signal;

a second clock phase generation circuit generating a second control clock signal, the second clock phase generation circuit being clocked by the second clock signal; and a second shift register having a second input terminal and a second output terminal, the second input terminal of the second shift register being coupled to the first output terminal of the first shift register, the second shift register being clocked by the second control clock signal; and a storage memory structure coupled to the second output terminal of the second shift register;

wherein a data signal received at the first input terminal of the first shift register is clocked through the first shift register by the first control clock signal and wherein the data signal is clocked through the second shift register by the second control clock signal.

4. The memory system of claim 3, wherein a rising edge of the second clock signal occurs a first time period after a rising edge of the first clock signal, and a falling edge of the second clock signal occurs the first time period prior to a falling edge of the first clock signal.

5. A method of storing data comprising the steps of:
creating a first clock signal and a second clock signal from a system clock signal, the first clock signal and the second clock signal being nested;
creating a first control clock signal from the first clock signal;
creating a second control clock signal from the second clock signal;
shifting a data signal through a first shift register in response to the first control clock signal;
shifting the data signal through a second shift register in response to the second control clock signal; and
storing the data signal received from the second shift register in a memory structure.

6. The method of claim 5, wherein a rising edge of the second clock signal occurs a first time period after a rising edge of the first clock signal, and a falling edge of the second clock signal occurs the first time period prior to a falling edge of the first clock signal.

7. The method of claim 5, further including the step of storing the data signal received from the first shift register in the memory structure.

8. A memory system comprising:
a first serial-in serial-out shift register receiving a data signal, the first shift register being controlled by a first clock signal;
a second serial-in serial-out shift register coupled in series with the first shift register and providing an output data signal, the second shift register being controlled by a second clock signal; and
a third serial-in serial-out shift register coupled in series with the first and second shift registers and providing a third output data signal, the third shift register being controlled by a third clock signal, wherein the first, second, and third clock signals are different clock signals.

9. The memory system of claim 8, wherein a rising edge of the second clock signal occurs a first time period after a rising edge of the first clock signal, a rising edge of the third clock signal occurs a second time period after the rising edge of the second clock signal, a falling edge of the second clock signal occurs a third time period prior to a falling edge of the first clock signal, and a falling edge of the third clock signal occurs a fourth time period prior to the falling edge of the second clock signal.

10. The memory system of claim 9, wherein the first and second time periods are equal.

11. The memory system of claim 9, wherein the third and fourth time periods are equal.

12. The memory system of claim 9, wherein the second and third time periods are equal.

13. The memory system of claim 9, wherein the first and fourth time periods are equal.

14. A memory system comprising:
a clock delay circuit generating a first clock signal, a second clock signal, and a third clock signal, wherein the first, second, and third clock signals are different clock signals;
a first clock phase generation circuit generating a first control clock signal, the first clock phase generation circuit being clocked by the first clock signal;
a first shift register having a first input terminal and a first output terminal, the first shift register being clocked by the first control clock signal;
a second clock phase generation circuit generating a second control clock signal, the second clock phase generation circuit being clocked by the second clock signal;
a second shift register having a second input terminal and a second output terminal, the second input terminal of the second shift register being coupled to the first output terminal of the first shift register, the second shift register being clocked by the second control clock signal;
a third clock phase generation circuit generating a third control clock signal, the third clock phase generation circuit being clocked by the third clock signal; and
a third shift register having a third input terminal and a third output terminal, the third input terminal of the third shift register being coupled to the second output terminal of the second shift register, the third shift register being clocked by the third control clock signal; and
a storage memory structure coupled to the first, second, and third output terminals;
wherein a data signal received-at the first input terminal is clocked through the first shift register by the first control clock signal, a data signal received at the second input terminal is clocked through the second shift register by the second control clock signal, and a data signal received at the third input terminal is clocked through the third shift register by the third control clock signal.

15. The memory system of claim 14, wherein a rising edge of the second clock signal occurs a first time period after a rising edge of the first clock signal, a rising edge of the third clock signal occurs a second time period after the rising edge of the second clock signal, a falling edge of the second clock signal occurs a third time period prior to a falling edge of the first clock signal, and a falling edge of the third clock signal occurs a fourth time period prior to the falling edge of the second clock signal.

16. A method of storing data comprising the steps of:
creating a first clock signal, a second clock signal, and a third clock signal from a system clock signal, wherein the first, second, and third clock signals are different clock signals;
creating a first control clock signal from the first clock signal;
creating a second control clock signal from the second clock signal;
creating a third control clock signal from the third clock signal;
shifting a data signal through a first shift register in response to the first control clock signal;
shifting the data signal through a second shift register in response to the second control clock signal, wherein the second shift register is coupled in series with the first shift register;
shifting the data signal through a third shift register in response to the third control clock signal, wherein the third shift register is coupled in series with the second shift register; and
storing the data signal received from the second shift register in a memory structure.

17. The memory system of claim 16, wherein a rising edge of the second clock signal occurs a first time period after a rising edge of the first clock signal, a rising edge of the third clock signal occurs a second time period after the rising edge of the second clock signal, a falling edge of the second clock signal occurs a third time period prior to a falling edge of the first clock signal, and a falling edge of the third clock signal occurs a fourth time period prior to the falling edge of the second clock signal.

* * * * *